(12) United States Patent
Misaki

(10) Patent No.: US 6,704,069 B2
(45) Date of Patent: Mar. 9, 2004

(54) TFT-LCD HAVING PARTICULAR GATE INSULATOR STRUCTURE

(75) Inventor: Katsunori Misaki, Kawasaki (JP)

(73) Assignee: Fujitsu Display Technologies Corporation, Kawaski (JP)

( * ) Notice: Subject to any disclaimer, the term of this patent is extended or adjusted under 35 U.S.C. 154(b) by 0 days.

(21) Appl. No.: 10/186,825

(22) Filed: Jul. 1, 2002

(65) Prior Publication Data

US 2002/0180903 A1 Dec. 5, 2002

Related U.S. Application Data

(62) Division of application No. 09/942,194, filed on Aug. 29, 2001, now Pat. No. 6,445,428, which is a division of application No. 09/251,044, filed on Feb. 18, 1999, now Pat. No. 6,323,917.

(30) Foreign Application Priority Data

May 28, 1998 (JP) .......................... 10-147761

(51) Int. Cl.[7] .............................................. G02F 1/136
(52) U.S. Cl. .......................................... 349/46; 257/59
(58) Field of Search .............................. 349/42, 43, 46; 257/59, 72

(56) References Cited

U.S. PATENT DOCUMENTS

| | | | |
|---|---|---|---|
| 5,621,556 A | 4/1997 | Fulks et al. | 349/42 |
| 5,731,856 A | 3/1998 | Kim et al. | 349/43 |
| 5,867,242 A | 2/1999 | Yao et al. | 349/122 |
| 5,883,682 A | * 3/1999 | Kim et al. | 349/43 |

FOREIGN PATENT DOCUMENTS

| | | |
|---|---|---|
| JP | 03220529 | 9/1991 |
| KR | 97-52925 | 7/1997 |

* cited by examiner

*Primary Examiner*—Toan Ton
(74) *Attorney, Agent, or Firm*—Greer, Burns & Crain, Ltd.

(57) ABSTRACT

A thin-film transistor of a liquid crystal display device includes an ohmic electrode such that the ohmic electrode is formed of a first conductor film of a refractory metal element defined by a first lateral edge and a second conductor film containing Al and defined by a second lateral edge, wherein the second lateral edge is receded with respect to the first lateral edge when viewed in a direction perpendicular to a substrate on which the thin-film transistor is formed.

4 Claims, 7 Drawing Sheets

10

TFT-LCD HAVING PARTICULAR GATE INSULATOR STRUCTURE

This is a divisional of application Ser. No. 09/942,194, filed Aug. 29, 2001, now U.S. Pat. No. 6,445,428, which is a divisional of Ser. No. 09/251,044, filed Feb. 18, 1999, now U.S. Pat. No. 6,323,917.

BACKGROUND OF THE INVENTION

The present invention generally relates to liquid crystal display devices and more particularly to a liquid crystal display device having a thin-film transistor (TFT).

Liquid crystal display devices are used extensively in information processing apparatuses such as a computer as a compact display device consuming little electric power.

In order to realize a high-quality color representation, recent liquid crystal display devices tend to use a so-called active-matrix driving method, in which each of the pixel electrodes in the liquid crystal display device is turned on and off by a corresponding TFT that is provided on a glass substrate constituting the liquid crystal display device in correspondence to the pixel electrode.

FIG. 1 shows the construction of a conventional active-matrix type liquid crystal display device 10.

Referring to FIG. 1, the liquid crystal display device 10 includes a TFT glass substrate 11 carrying thereon a number of TFTs and corresponding transparent pixel electrodes, and a glass substrate 12 is provided on the TFT substrate 11 so as to face the TFT substrate 11 with a gap formed therebetween. The gap thus formed is filled by a liquid crystal layer 1 in the state that the liquid crystal layer 1 is confined between the TFT substrate 11 and the opposing substrate 12 by a seal member not illustrated.

In the conventional liquid crystal display device 10 of the foregoing construction, the direction of the liquid crystal molecules in the liquid crystal layer 1 is selectively modified by applying a drive voltage to a selected pixel electrode via a corresponding TFT.

Further, it should be noted that the liquid crystal display device 10 includes a pair of polarizers at respective outer sides of the glass substrates 11 and 12 in the crossed Nicol state, and the glass substrates 11 and 12 further carry molecular alignment films on the respective interior sides thereof in contact with the liquid crystal layer 1.

FIG. 2 shows a part of the TFT substrate 11 in an enlarged scale.

Referring to FIG. 2, the TFT substrate 11 carries thereon a number of pad electrodes 11A for receiving a scanning signal and a number of scanning electrodes 11a each extending from a corresponding pad electrode 11A in a first direction. Further, the TFT substrate 11 carries thereon a number of pad electrodes 11B for receiving an image signal and a number of signal electrodes 11b each extending from a corresponding pad electrode 11B in a second direction generally perpendicular to the first direction. Further, in correspondence to each intersection of a scanning electrode 11a and a signal electrode 11b, there is provided a TFT 11C and a corresponding transparent pixel electrode 11D.

In the liquid crystal display device 10 of the foregoing construction, one of the scanning electrodes 11a is selected by selectively supplying a scanning signal to the corresponding electrode pad 11A. Further, a signal electrode 11b is selected by supplying an image signal to the corresponding electrode pad 11B. Thereby, the image signal is forwarded to the corresponding transparent pixel electrode 11D via the TFT 11C.

FIG. 3 shows the construction of a conventional TFT 11C.

Referring to FIG. 3, the TFT 11C is constructed on a glass substrate 21 corresponding to the TFT substrate 11 of FIG. 1 and includes a gate electrode 22 formed on the glass substrate 21 in electrical connection to the scanning electrode 11a, wherein a gate insulation film 23 provided on the glass substrate 21 covers the gate electrode 22. Further, an amorphous silicon pattern 24 is provided on the gate insulation film 23 so as to cover the gate electrode 22. Typically, the gate electrode 22 is formed of an Al—Nd alloy or an Al—Sc alloy.

It should be noted that the foregoing amorphous silicon pattern 24 constitutes the active region of the TFT 11C and is covered by a channel protection pattern 25 of SiN in the part corresponding to the channel region of the TFT 11C located immediately above the gate electrode 22.

On the amorphous silicon pattern 24, there are provided a pair of amorphous silicon patterns 26A and 26B of the $n^+$-type at both lateral sides of the channel protection pattern 25, and the amorphous silicon pattern 26A carries thereon a Ti layer 27a, an Al layer 27b and a Ti layer 27c consecutively, wherein the layers 27a–27c constitute an ohmic electrode 27A connected to the signal electrode 11b. Similarly, the amorphous silicon pattern 26B carries thereon a Ti layer 27d, an Al layer 27e and a Ti layer 27f consecutively, wherein the layers 27d–27f constitute an ohmic electrode 27B.

It should be noted that the ohmic electrodes 27A and 27B are covered by a protective film 28 of SiN, and a transparent pixel electrode 29 of $In_2SnO_5$ (ITO) is provided on the protective film 28, wherein the pixel electrode 29 makes a contact with the uppermost Ti layer 27f of the ohmic electrode 27B via a contact hole formed in the protective film 28.

In the TFT 11C having such a construction, it should be noted that the conduction between the ohmic electrode 27A and the ohmic electrode 27B via the channel region formed in the amorphous silicon pattern 24 is controlled in response to the scanning signal supplied to the gate electrode, and the pixel electrode 29 corresponding to the TFT 11C thus turned on is selectively activated by the image signal supplied to the ohmic electrode 27A.

It should be noted that the fabrication process of the TFT 11C of FIG. 3 includes the steps of consecutively depositing, on an amorphous silicon layer constituting the amorphous silicon patterns 26A and 26B, a Ti layer corresponding to the Ti layers 27a and 27b, an Al layer corresponding to the Al layers 27b and 27e, and a Ti layer corresponding to the Ti layers 27c and 27f, followed by a patterning process conducted on the layered structure thus obtained by a dry etching process while using an etching mask. The dry etching process may be conducted typically by an RIE (reactive ion etching) process that uses a mixture of $Cl_2$ and $BCl_3$ as an etching gas. As a result of the dry etching process, the foregoing amorphous silicon patterns 26A, 26B and the electrode patterns 27A and 27B are patterned on the amorphous silicon pattern 24 substantially simultaneously.

In such a fabrication process of the TFT 11C, it should be noted that the Al pattern 27b or 27e may experience a selective lateral etching at the exposed edge part of the electrode patterns 27A and 27B as indicated in FIG. 3. When such a selective lateral etching occurs in the Al patterns 27b and 27e, there inevitably occurs a problem of overhang formation at the edge part of the ohmic electrode 27A or 27B, wherein the existence of such an overhang structure may induce the problem of failure of electrical connection in the patterns connected to the ohmic electrode 27A or 27B. For example, the electrical connection of the pixel electrode 29 to the ohmic electrode 27B may suffer from such a failure at the receded side edge of the Al pattern 27e.

While it is possible to suppress the overhang formation in the foregoing dry etching process by enhancing the anisotropy of the etching process, such a highly anisotropic dry etching process is also disadvantageous in eliminating the electrical connection failure, as a vertical side edge of the ohmic electrodes 27A and 27B, formed as a result of the highly anisotropic dry etching process, tends to induce a poor step coverage in the conductor pattern such as the pixel electrode 29 extending across the vertical side edge.

SUMMARY OF THE INVENTION

Accordingly, it is a general object of the present invention to provide a novel and useful thin-film transistor, liquid crystal display device using such a thin-film transistor and a fabrication process thereof wherein the foregoing problems are eliminated.

Another and more specific object of the present invention is to provide a reliable thin-film transistor for use in a liquid crystal display device of the active-matrix type.

Another object of the present invention is to provide a fabrication process of a thin-film transistor for use in a liquid crystal display device of the active-matrix type wherein the yield of production is improved.

Another object of the present invention is to provide a thin-film transistor having a protective insulation film covering said thin-film transistor and a pixel electrode provided on said protective insulation film in electrical connection with said thin-film transistor, comprising:

a gate electrode provided on a substrate;
a gate insulation film provided on said substrate so as to cover said gate electrode;
a semiconductor layer provided on said gate insulation film so as to cover said gate electrode when viewed in a direction perpendicular to a principal surface of said substrate;
a first ohmic electrode provided on said semiconductor layer so as to be located at a first side of said gate electrode when viewed in a direction perpendicular to said principal surface;
a second ohmic electrode provided on said semiconductor layer so as to be located at a second, opposite side of said gate electrode when viewed in a direction perpendicular to said principal surface;
said second ohmic electrode comprising:
  a first conductor film containing a refractory metal element, said first conductor film having a lateral edge; and
  a second conductor film provided on said first conductor film, said second conductor film being covered intimately by said protective insulation film and containing Al therein,
  wherein said second conductor film has a lateral edge corresponding to said lateral edge of said first conductor film such that said lateral edge of said second conductor film is located flush to or inside said lateral edge of said first conductor film when viewed in a direction perpendicular to said substrate.

Another object of the present invention is to provide a thin-film transistor having a protective insulation film covering said thin-film transistor and a pixel electrode provided on said protective insulation film in electrical connection with said thin-film transistor, comprising:

a gate electrode provided on a substrate;
a gate insulation film provided on said substrate so as to cover said gate electrode;
a semiconductor layer provided on said gate insulation film so as to cover said gate electrode when viewed in a direction perpendicular to a principal surface of said substrate;
a first ohmic electrode provided on said semiconductor layer so as to be located at a first side of said gate electrode when viewed in a direction perpendicular to said principal surface;
a second ohmic electrode provided on said semiconductor layer so as to be located at a second, opposite side of said gate electrode when viewed in a direction perpendicular to said principal surface;
said gate insulation film comprising:
  an insulation pattern formed on said gate electrode; and
  a pair of insulation films disposed on said substrate at both sides of a gate structure including said gate electrode and said insulation pattern, such that said pair of insulation films have respective surfaces continuing to a surface of said insulation pattern.

Another object of the present invention is to provide a method of fabricating a thin-film transistor, comprising the steps of:

forming a gate electrode on a substrate;
forming a gate insulation film on said substrate so as to cover said gate electrode;
forming a semiconductor film on said gate insulation film;
forming an electrode layer on said semiconductor film by depositing a first conductor layer containing a refractory metal element and a second conductor layer containing Al consecutively;
applying a dry etching process to said electrode layer to form a first ohmic electrode pattern located at a first side of said gate electrode and a second ohmic electrode pattern located at a second, opposite side of said gate electrode;
covering said first and second ohmic electrode patterns by a protective insulation film such that said protective insulation film contacts each of said first and second ohmic electrode patterns intimately;
forming a contact hole in said protective insulation film so as to expose said second conductor layer at said contact hole; and
forming a pixel electrode on said protective insulation film to as to achieve an electrical contact with said second ohmic electrode pattern at said contact hole.

Another object of the present invention is to provide a method of fabricating a thin-film transistor, comprising the steps of:

forming said gate electrode on a substrate;
forming a gate insulation film on said substrate so as to cover said gate electrode;
forming a semiconductor film on said gate insulation film;
forming an electrode layer on said semiconductor film by depositing a first conductor layer containing a refractory metal element and a second conductor layer containing Al consecutively;
applying a dry etching process to said electrode layer to form a first ohmic electrode pattern located at a first side of said gate electrode and a second ohmic electrode pattern located at a second, opposite side of said gate electrode;

wherein said step of forming said gate insulation film includes the steps of:
  forming an insulation pattern on said gate electrode with a shape in conformity with a shape of said gate electrode to form a gate structure;
  forming a planarizing insulation film on said first substrate by a spin-coating process, such that said planarizing insulation film covers said gate structure; and
  etching back said planarizing insulation film.

Another object of the present invention is to provide a liquid crystal display device, comprising:
  a first substrate;
  a second substrate facing said first substrate;
  a liquid crystal layer confined between said first substrate and said second substrate;
  a thin-film transistor provided on said first substrate;
  a protective insulation film covering said thin-film transistor; and
  a pixel electrode provided on said protective insulation film in electrical connection with said thin-film transistor,
  said thin-film transistor comprising:
    a gate electrode provided on said first substrate;
    a gate insulation film provided on said first substrate so as to cover said gate electrode;
    a semiconductor layer provided on said gate insulation film so as to cover said gate electrode when viewed in a direction perpendicular to a principal surface of said first substrate;
    a first ohmic electrode provided on said semiconductor layer so as to be located at a first side of said gate electrode when viewed in a direction perpendicular to said principal surface;
    a second ohmic electrode provided on said semiconductor layer so as to be located at a second, opposite side of said gate electrode when viewed in a direction perpendicular to said principal surface;
    said second ohmic electrode comprising:
      a first conductor film containing a refractory metal element, said first conductor film having a lateral edge; and
      a second conductor film provided on said first conductor film, said second conductor film being covered intimately by said protective insulation film and containing Al therein,
      wherein said second conductor film has a lateral edge corresponding to said lateral edge of said first conductor film such that said lateral edge of said second conductor film is located flush to or inside said lateral edge of said first conductor film when viewed in a direction perpendicular to said first substrate.

Another object of the present invention is to provide a method of fabricating a liquid crystal display device comprising: a first substrate; a second substrate facing said first substrate; a liquid crystal layer confined between said first substrate and said second substrate; a thin-film transistor provided on said first substrate; a protective insulation film covering said thin-film transistor; and a pixel electrode provided on said protective insulation film in electrical connection with said thin-film transistor, said method comprising the steps of:
  forming said gate electrode on said first substrate;
  forming a gate insulation film on said first substrate so as to cover said gate electrode;
  forming said semiconductor film on said gate insulation film;
  forming an electrode layer on said semiconductor film by depositing a first conductor layer containing a refractory metal element and a second conductor layer containing Al consecutively;
  applying a dry etching process to said electrode layer to form a first ohmic electrode pattern located at a first side of said gate electrode and a second ohmic electrode pattern located at a second, opposite side of said gate electrode;
  covering said first and second ohmic electrode patterns by said protective insulation film such that said protective insulation film contacts each of said first and second ohmic electrode patterns intimately;
  forming a contact hole in said protective insulation film so as to expose said second conductor layer at said contact hole; and
  forming said pixel electrode on said protective insulation film to as to achieve an electrical contact with said second ohmic electrode pattern at said contact hole.

According to the present invention, the second conductor pattern, being located inside the first conductor pattern, never forms an overhang structure with respect to the adjacent first conductor pattern, and the step coverage of the protective film over the thin-film transistor is improved substantially. Associated therewith, the risk of the pixel electrode containing defect as a result of the poor step coverage of the protective insulation film is reduced substantially.

Another object of the present invention is to provide a liquid crystal display device, comprising:
  a first substrate;
  a second substrate facing said first substrate;
  a liquid crystal layer confined between said first substrate and said second substrate;
  a thin-film transistor provided on said first substrate;
  a protective insulation film covering said thin-film transistor; and
  a pixel electrode provided on said protective insulation film in electrical connection with said thin-film transistor,
  said thin-film transistor comprising:
    a gate electrode provided on said first substrate;
    a gate insulation film provided on said first substrate so as to cover said gate electrode;
    a semiconductor layer provided on said gate insulation film so as to cover said gate electrode when viewed in a direction perpendicular to a principal surface of said first substrate;
    a first ohmic electrode provided on said semiconductor layer so as to be located at a first side of said gate electrode when viewed in a direction perpendicular to said principal surface;
    a second ohmic electrode provided on said semiconductor layer so as to be located at a second, opposite side of said gate electrode when viewed in a direction perpendicular to said principal surface;
    said gate insulation film comprising:
      an insulation pattern formed on said gate electrode; and
      a pair of insulation films disposed on said first substrate at both sides of a gate structure including said gate electrode and said insulation pattern, such that said pair of insulation films have respective surfaces continuing to a surface of said insulation pattern.

Another object of the present invention is to provide a method of fabricating a liquid crystal display device comprising: a first substrate; a second substrate facing said first substrate; a liquid crystal layer confined between said first substrate and said second substrate; a thin-film transistor provided on said first substrate; a protective insulation film covering said thin-film transistor; and a pixel electrode provided on said protective insulation film in electrical connection with said thin-film transistor, said method comprising the steps of:

forming said gate electrode on said first substrate;

forming a gate insulation film on said first substrate so as to cover said gate electrode;

forming said semiconductor film on said gate insulation film;

forming an electrode layer on said semiconductor film by depositing a first conductor layer containing a refractory metal element and a second conductor layer containing Al consecutively;

applying a dry etching process to said electrode layer to form a first ohmic electrode pattern located at a first side of said gate electrode and a second ohmic electrode pattern located at a second, opposite side of said gate electrode;

wherein said step of forming said gate insulation film includes the steps of:

forming an insulation pattern on said gate electrode with a shape in conformity with a shape of said gate electrode to form a gate structure;

forming a planarizing insulation film on said first substrate by a spin-coating process, such that said planarizing insulation film covers said gate structure; and etching back said planarizing insulation film.

According to the present invention, the gate electrode, being covered by the insulation pattern at a top part thereof, is effectively protected from contamination even in such a case in which the foregoing pair of insulation films are formed at both sides of the gate structure by a spin coating process of an organic insulation film. By providing the organic insulation film as noted above at both sides of the gate electrode, an effective planarization is achieved for the gate structure.

Other objects and further features of the present invention will become apparent from the following detailed description when read in conjunction with the attached drawings.

DETAILED DESCRIPTION OF THE PREFERRED EMBODIMENTS

[First Embodiment]

Figure 1:
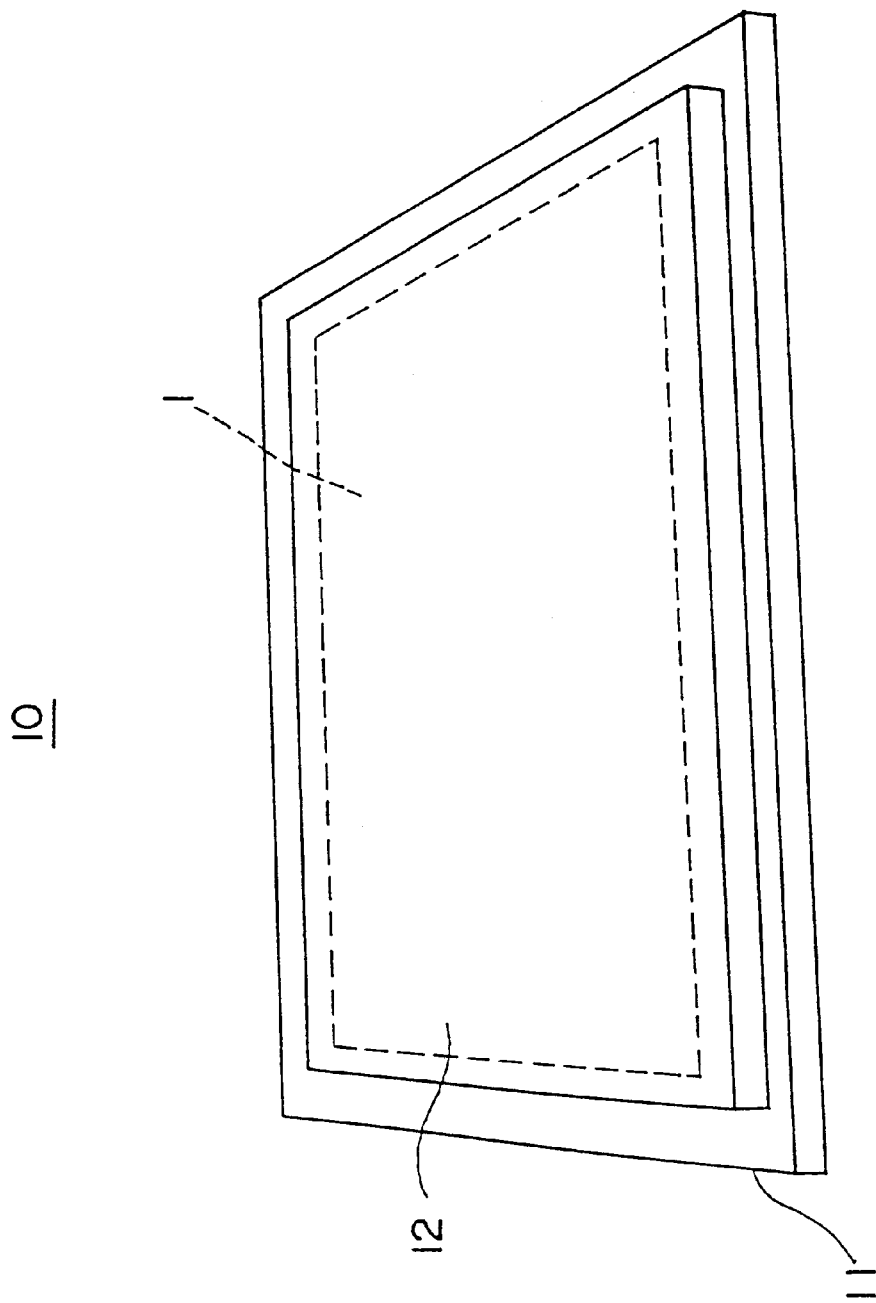
FIG. 1 is a diagram showing the general construction of a conventional liquid crystal display device.
Figure 2:
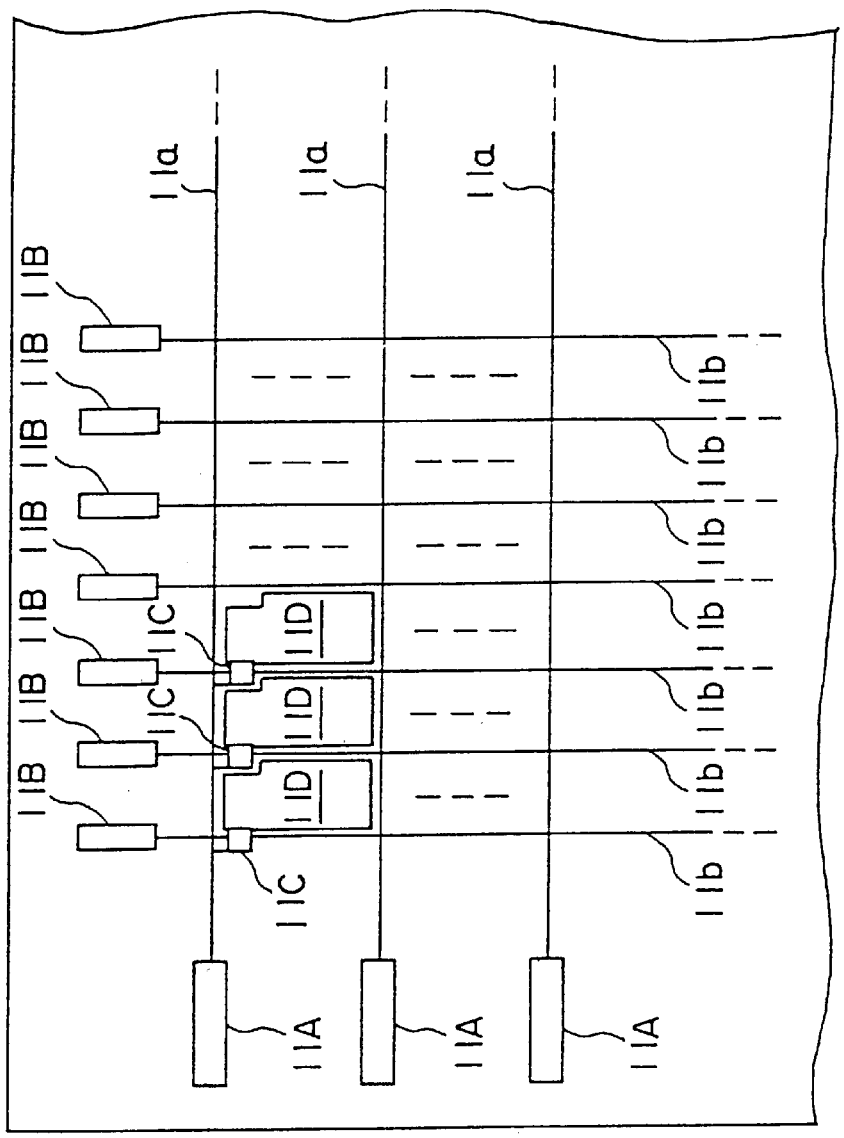
FIG. 2 is a diagram showing a TFT array formed on a glass substrate in the liquid crystal display device of FIG. 1.
Figure 3:
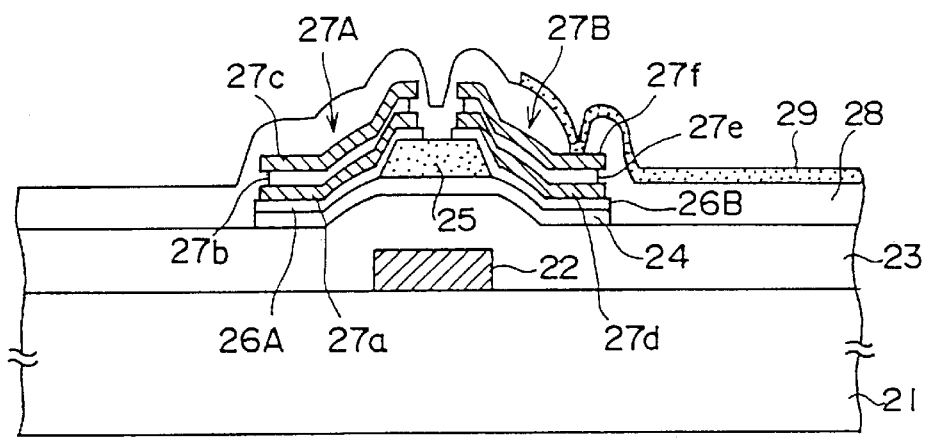
FIG. 3 is a diagram showing the construction of a conventional TFT.
Figure 4:
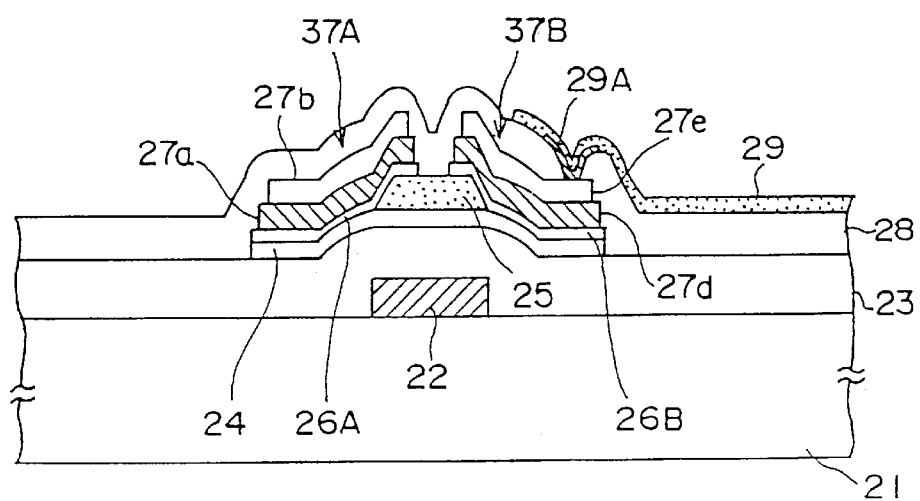
FIG. 4 is a diagram showing the construction of a TFT according to a first embodiment of the present invention.

FIG. 4 shows the construction of a TFT 30 according to a first embodiment of the present invention, wherein the TFT 30 may be used in the liquid crystal display device 11 of FIGS. 1 and 2 in place of the TFT 11C. In FIG. 4, those parts corresponding to the parts described previously are designated by the same reference numerals and the description thereof will be omitted.

Referring to FIG. 4, the TFT 30 has a construction similar to that of the TFT 11C except that the ohmic electrode 27A or ohmic electrode 27B, in which the conductor layers 27a–27c or 27d–27f are stacked consecutively, is replaced with an ohmic electrode 37A or ohmic electrode 37B, wherein the ohmic electrode 37A includes a stacking of only the conductor layer 27a of Ti and the conductor layer 27b of Al or an Al alloy. Similarly, the ohmic electrode 37B includes a stacking of only the conductor layer 27d of Ti and the conductor layer 27e of Al or an Al alloy. Here, it should be noted that the conductor layer 27a or 27d of Ti acts as a barrier metal layer prohibiting the reaction between the conductor layer 27b or 27e containing Al therein and the amorphous silicon pattern 26A or 26B underneath the barrier metal layer.

As can be seen in FIG. 4, the conductor layer 27a has a lateral edge at a position flush to or receded from a corresponding lateral edge of the $n^+$-type amorphous silicon pattern 26A underneath the conductor layer 27a. Further, the conductor layer 27b on the conductor layer 27a has a lateral edge further receded from the lateral edge of the conductor layer 27a. Similarly, the conductor layer 27d has a lateral edge flush to or receded from a corresponding lateral edge of the $n^+$-type amorphous silicon pattern 26B underneath the conductor layer 27d, and the conductor layer 27e on the conductor layer 27d has a lateral edge further receded from the lateral edge of the conductor layer 27d. Further, the protective insulation film 28 is provided on the structure of FIG. 4 so as to cover the ohmic electrodes 37A and 37B so as to make a direct contact with the conductor layer 27b or 27e.

According to the construction as noted above, it should be noted that the step coverage of the protective insulation film 28 over the ohmic electrode 37A or 37B is improved substantially, even when the protective insulation film 28 is formed by a sputtering process of SiN. As a result of the improved step coverage, the protective insulation film 28 has a gently inclined surface, and thus, the transparent pixel electrode 29 of ITO covers the protective insulation film 28 with a generally uniform thickness. Thereby, the problem of disconnection of the transparent pixel electrode 29, which tends to occur when the protective insulation film 28 has a steeply inclined surface, is effectively eliminated.

It should be noted that the protective insulation film 28 is formed with a contact hole exposing the conductor layer 27e of the ohmic electrode 37B and a Ti barrier pattern 29A is provided on the protective insulation film 28 in contact with the exposed conductor layer 27e at the foregoing contact hole. Thereby, the transparent pixel electrode 29 is connected to the ohmic electrode 37B at the foregoing contact hole via the Ti barrier pattern 29A. By interposing the Ti pattern 29A between the ITO pixel electrode 29 and the conductor layer 27e of Al or an Al alloy, the problem of increase of the resistance, which tends to occur when the ITO pixel electrode 29 contacts directly with the conductor layer 27e, is effectively avoided.

In order to minimize the optical loss of the liquid crystal display device 11, it is preferable to form the foregoing Ti barrier pattern 29A within the active region of the TFT formed by the amorphous silicon pattern 24. Alternatively, the Ti barrier pattern 29A may be formed with a thickness of about 30 nm or less, for allowing a passage of optical beam.

FIGS. 5A–5E show a fabrication process of the TFT 30.

Figure 5A:
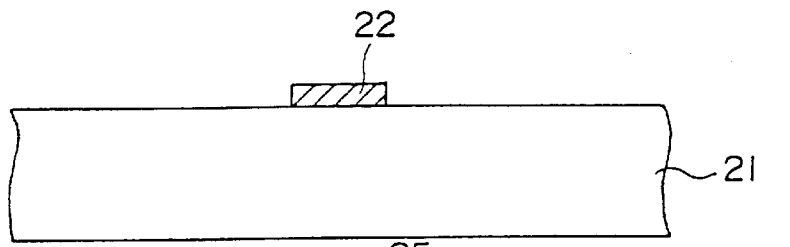
FIGS. 5A–5E are diagrams showing the fabrication process of the TFT of FIG. 4.
Figure 5B:
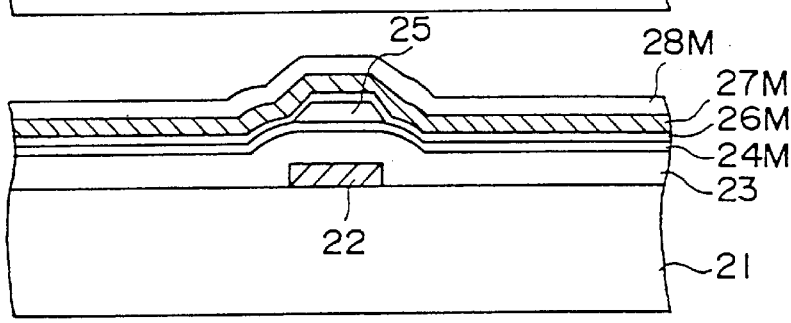

Referring to FIG. 5A, the gate electrode 22 typically of Al or an Al alloy is formed on the glass substrate 21 by a PVD process such as a sputtering process, and the gate insulation film 23 is provided in the step of FIG. 5B such that the gate insulation film 23 covers the gate electrode 22. The detailed process of forming the gate insulation film 23 will be described later with reference to another embodiment.

In the step of FIG. 5B, a layer 24M of amorphous silicon of either the p-type, undoped or n-type, is formed further on the gate insulation film 23 by a CVD process with a thickness of about 30 nm, as the active layer of the TFT 30. In addition, the protective pattern 25 of $SiO_2$, SiN or SiON is formed on the amorphous silicon layer 24M by a plasma CVD process with a thickness of about 120 nm, wherein the protective pattern 25 is provided in correspondence to the gate electrode 22 and acts as a protective pattern protecting the channel region of the TFT 30 formed in the amorphous silicon layer 24M.

Next, in the step of FIG. 5B, an amorphous silicon layer 26M of the $n^+$-type is formed on the amorphous silicon layer 24M so as to cover the channel protective pattern 25 with a generally uniform thickness, and a Ti layer 27M and a conductor layer 28M of Al or an Al alloy are deposited consecutively on the amorphous silicon layer 26M by a PVD process.

Figure 5C:
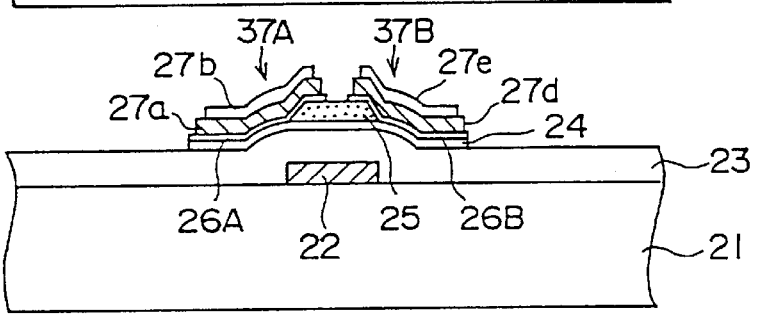

Next, in the step of FIG. 5C, a dry etching process is applied to the structure of FIG. 5B by using a mixture of $Cl_2$ and $BCl_3$ as an etching gas, to conduct a patterning of the layers 24M–28M simultaneously, wherein the foregoing amorphous silicon pattern 24, the doped amorphous silicon patterns 26A and 26B, and the ohmic electrodes 37A and 37B further thereon are formed substantially simultaneously.

During the dry etching process of FIG. 5C, the concentration of $Cl_2$ in the etching gas is preferably set to be 40% or more, for setting the lateral etching rate of the Ti layer 27M, and hence the lateral etching rate of the Ti patterns 27a and 27d, to be equal to or larger than lateral etching rate of the amorphous silicon layers 24M or 26M, and hence the lateral etching rate of the amorphous silicon pattern 24 or the amorphous silicon patterns 26A and 26B. By using such a dry etching gas composition, it is also possible to set the lateral etching rate of the layer 28M of Al or an Al alloy, and hence the lateral etching rate of the conductor patterns 27b and 27e, to be equal to or larger than the lateral etching rate of the Ti patterns 27a and 27b.

Figure 5D:
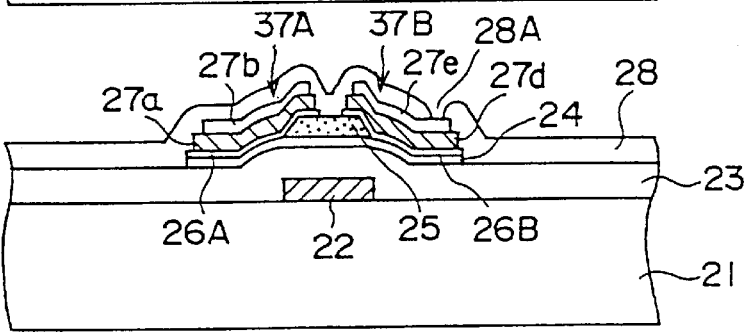

Next, in the step of FIG. 5D, a protective insulation film 28 of SiN is provided on the structure of FIG. 5C by a plasma CVD process and a contact hole 28A is formed in the protective insulation film 28 thus formed such that the contact hole 28A exposes the conductor pattern 27e of the ohmic electrode 37B.

Figure 5E:
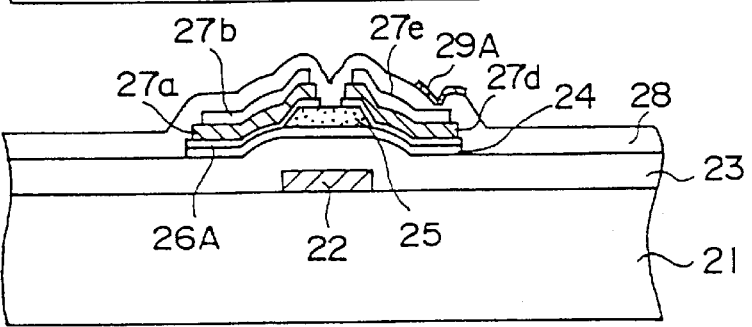

Further, the Ti pattern 29A is provided in the step of FIG. 5E with a thickness of less than about 30 nm, preferably about 20 nm, such that the Ti pattern 29A makes a contact with the exposed conductor pattern 27e at the contact hole 28A.

By providing the transparent pixel electrode 29 on the structure of FIG. 5E thus obtained, the fabrication of the TFT 30 is completed.

As explained before, the lateral etching rate is controlled in the dry etching step of FIG. 5C such that the lateral etching rate increases consecutively from the lowermost level patterns 26A and 26B to the uppermost level patterns 27b and 27e. Thereby, there is formed a stepped structure suitable for covering with the protective insulation film 28 in the step of FIG. 5D.

Further, the present embodiment provides an advantageous feature of suppressing the increase of resistance of the pixel electrode 29, by interposing the Ti pattern 29A between the pixel electrode 29 and the conductor pattern 27e.

[Second Embodiment]

Figure 6:
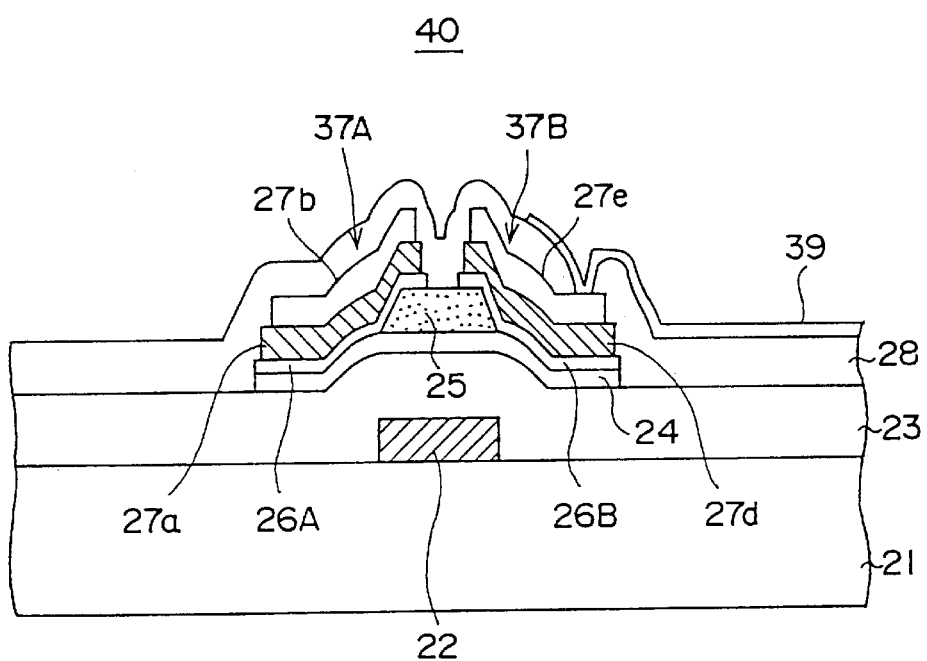
FIG. 6 is a diagram showing the construction of a TFT according to a second embodiment of the present invention.

FIG. 6 shows the construction of a TFT 40 according to a second embodiment of the present invention, wherein those parts corresponding to the parts described previously are designated by the same reference numerals and the description thereof will be omitted.

Referring to FIG. 6, the TFT 40 has a construction similar to that of the TFT 30 except that the Ti pattern 29A is now omitted and a pixel electrode 39 of Ti is provided in direct contact with the conductor layer 27e of the ohmic electrode 27B, in place of the ITO pixel electrode 29. By setting the thickness of the Ti pixel electrode 39 to be about 30 nm or less, it is possible to secure a sufficient optical transparency for the pixel electrode 39.

According to the construction of the TFT 40 of FIG. 6, the step of formation of the Ti pattern 29A is omitted and the fabrication process of the liquid crystal display device including the TFT 40 is substantially facilitated.

As other features of the TFT 40 are identical with those of the TFT 30, further description of the TFT 40 will be omitted.

[Third Embodiment]

In the foregoing TFT 30 or 40, the gate insulation film 23 is generally formed of SiN, wherein the tendency of an SiN film to accumulate stress therein is well known in the art. Thus, in the liquid crystal display devices that use the TFTs 30 or 40 have a tendency of causing the problem of warping of the glass substrate 21, which corresponds to the TFT substrate 1 of FIG. 1. In the worst case, the SiN film constituting the gate insulation film 23 may cause an exfoliation. Further, the gate insulation film 23 thus formed of SiN tends to form a projection on the surface thereof in conformity with the shape of the gate electrode 22. In such a case, it becomes difficult to form the TFT on the gate insulation film 23 because of the existence of the projection.

FIGS. 7A–7E are diagrams showing the fabrication process of TFT 30 or 40 conducted such that the gate insulation film 23 has a planarized surface.

Figure 7A:
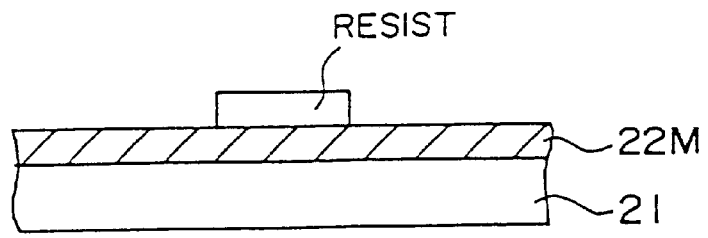
FIGS. 7A–7E are diagrams showing the fabrication process of a TFT according to a third embodiment of the present invention.

Referring to FIG. 7A, a conductor layer 22M of an Al—Nd alloy or an Al—Sc alloy is deposited on the glass substrate 21 by a PVD process, followed by a formation of a resist pattern in conformity with the shape of the gate electrode 22 to be formed.

Figure 7B:
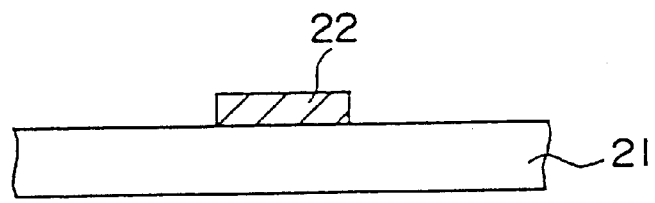
Figure 7C:
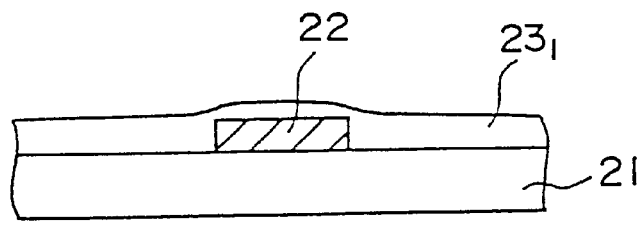

Next, in the step of FIG. 7B, the conductor layer 22M is patterned while using the resist pattern as a mask, to form the gate electrode 22. Further, an SOG (spin-on-glass) layer $23_1$ is deposited on the glass substrate 21 in the step of FIG. 7C such that the SOG layer $23_1$ covers the gate electrode 22.

Figure 7D:
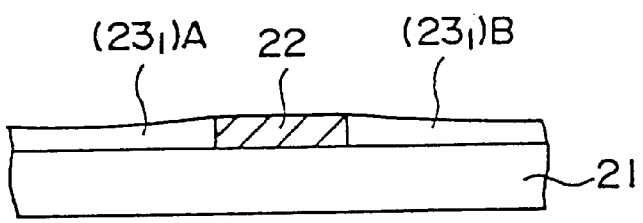

Next, in the step of FIG. 7D, the SOG layer $23_1$ is subjected to a sintering to form a solidified layer, followed by an etch back process conducted by using a buffered HF solution as an etchant, until the gate electrode 22 is exposed. As a result of the etch back process, there are formed SOG regions $(23_1)A$ and $(23_1)B$ on the substrate 21 at both lateral sides of the gate electrode 22.

Figure 7E:
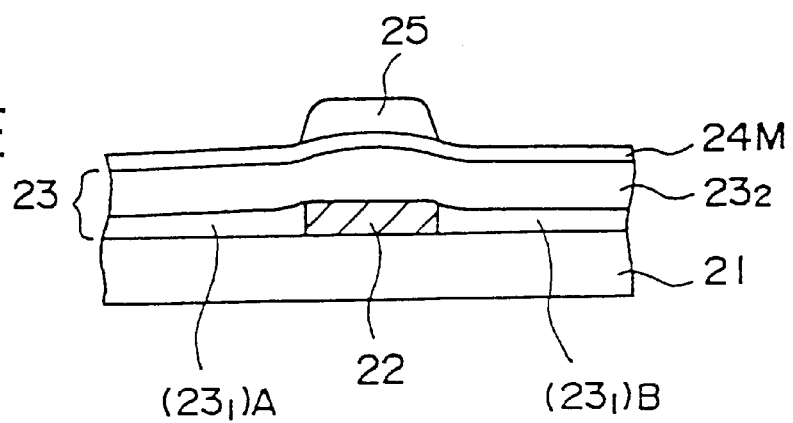

Next, in the step of FIG. 7E, an SiN film $23_2$ is deposited on the structure of FIG. 7D by a plasma CVD process, and the amorphous silicon layer 24 and the channel protective pattern 25 are formed on the SiN film $23_2$ by a plasma CVD process.

Further, by conducting the process steps described with reference to FIGS. 5B–5E on the structure of FIG. 7E thus formed, the TFT 30 or 40 is formed. In the TFT 30 or 40 thus obtained, it should be noted that the foregoing SOG regions $(23_1)$A and $(23_1)$B constitute the gate insulation film 23 together with the SiN film $23_2$.

In the present embodiment, it becomes possible to planarized the surface of the gate insulation film 23 by forming the SOG regions $(23_1)$A and $(23_1)$B at both sides of the gate electrode 22. Thereby the fabrication process of the TFT 30 or 40 on the gate insulation film 23 is substantially facilitated.

[Fourth Embodiment]

In the process of FIGS. 7A–7E described above, the gate insulation film 23 is formed with a planarized top surface. On the other hand, the structure of FIG. 7E, using SiN for the upper layer $23_2$ of the gate insulation film 23, cannot avoid the problem of accumulation of stress in the gate insulation film 23. Thus, the structure of FIG. 7E tends to cause the problem of warp in the TFT substrate 11 on which the TFTs of FIG. 7E are formed. Further, there is a substantial risk, because of the stress in the gate insulation film 23, in that a part of the upper layer $23_2$ may cause exfoliation and produce a dust. When such dust is formed, there is a substantial risk that the endurance voltage of the TFT may be degraded. Further, in the step of FIG. 7C, it should be noted that the surface of the gate electrode 22 is covered by the SOG film $23_1$, while such a process tends to induce an oxidation at the surface of the gate electrode 22. When such oxidation is caused, the threshold voltage of the TFT is inevitably changed.

FIGS. 8A–8E are diagrams showing the fabrication process of the TFT according to a fourth embodiment of the present invention, wherein those parts corresponding to the parts described previously are designated by the same reference numerals and the description thereof will be omitted.

Figure 8A:
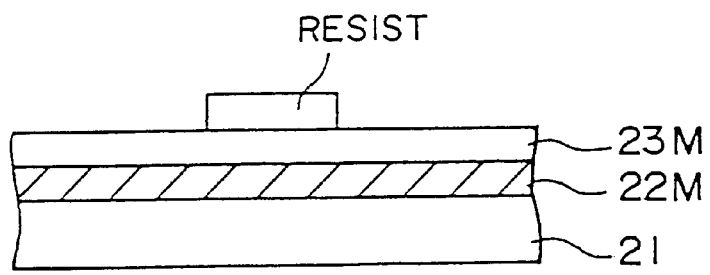
FIGS. 8A–8E are diagrams showing the fabrication process of a TFT according to a fourth embodiment of the present invention.

Referring to FIG. 8A, the glass substrate 21 is covered consecutively by a conductor layer 22M of an Al—Nd ally or an Al—Sc alloy and an SiN layer 23M, respectively with a thickness of about 500 nm and about 300 nm, wherein the conductor layer 22M may be deposited by a PVD process while the SiN layer 23M may be deposited by a plasma CVD process. Further, a resist pattern is formed on the SiN film 23M in correspondence to the gate electrode 22 to be formed.

Figure 8B:
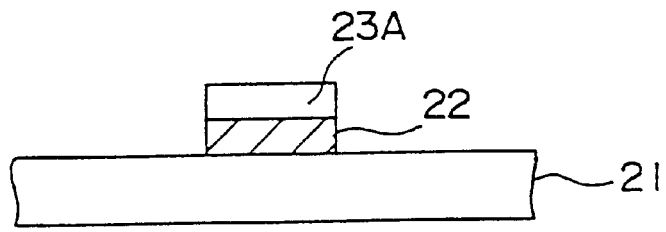

Next, in the step of FIG. 8B, the SiN layer 23M and the conductor layer 22 are subjected to a patterning process while using the resist pattern as a mask, to form the gate electrode 22 such that the gate electrode 22 is covered by an SiN pattern 23A.

Figure 8C:
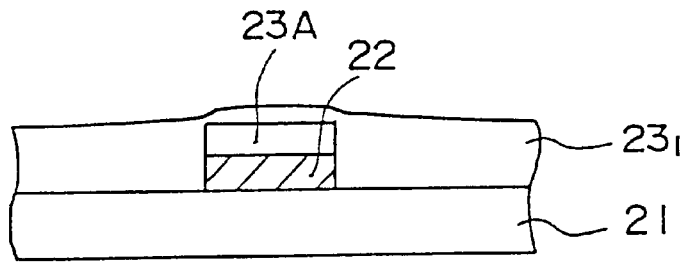

Next, in the step of FIG. 8C, an SOG layer $23_1$ is formed on the structure of FIG. 8B with a thickness of about 800 nm by a spin-coating process, such that the SOG layer $23_1$ covers the SiN pattern 23A. After the formation, the SOG layer $23_1$ is subjected to a sintering process.

Figure 8D:
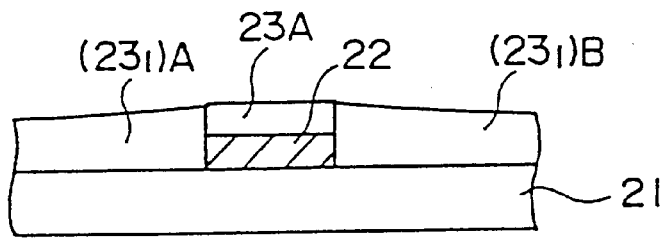

Next, in the step of FIG. 8D, the SOG layer $23_1$ thus sintered is subjected to an etch back process conducted by a wet etching process while using a buffered HF solution for the etchant, until the SiN pattern 23A is exposed. As a result, SOG regions $(23_1)$A and $(23_1)$B are formed on the substrate 21 at both lateral sides of the gate structure, which is formed by the gate electrode 22 and the SiN pattern 23 thereon, with a thickness of about 800 nm.

Figure 8E:
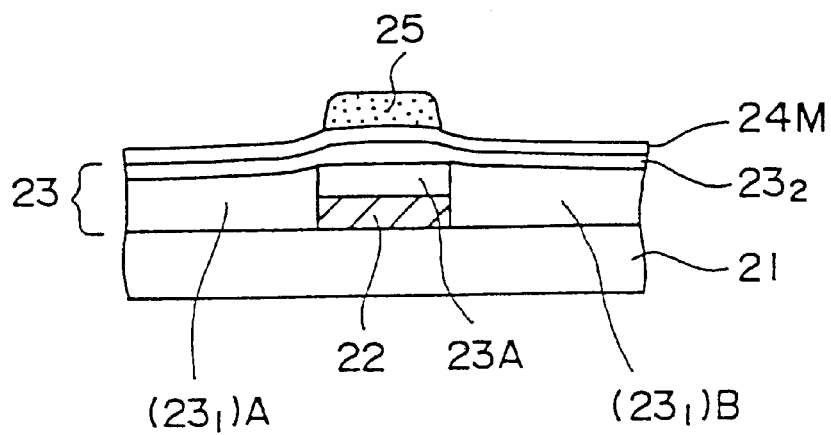

Next, in the step of FIG. 8E, a thin SiN film $23_2$ is deposited on the structure of FIG. 8D by a plasma CVD process with a thickness of about 100 nm, followed by a deposition of an amorphous silicon layer 24M further on the SiN film $23_2$ with a thickness of about 30 nm.

Further, a channel protective film 25 is formed on the amorphous silicon layer 24M with a thickness of about 120 nm. Furthermore, the steps of FIGS. 5B–5E are conducted on the structure of FIG. 8E, and the TFT 30 or 40 having the construction described previously are obtained. It should be noted that the TFT 30 or 40 fabricated according to such a process includes the SOG regions $(23_1)$A and $(23_1)$B as a part of the gate insulation film 23 together with the SiN film $23_2$.

According to the present embodiment, the problem of stress accumulation in the TFT substrate 11 caused by the gate insulation film 23, is successfully avoided by reducing the thickness of the SiN film $23_2$. As the conductor layer 22M, used for the gate electrode 22, is covered immediately by the SiN layer 23 after the formation thereof in the present embodiment, the problem of the top surface of the gate electrode 22 being contaminated by the organic material from the SOG film is effectively eliminated. Thereby, the problem of increase of the gate resistance as a result of use of SOG is eliminated. As the gate insulation film 23 is primarily formed by the SOG, the gate insulation film 23 has a highly planarized surface and the construction of a TFT on such a planarized gate insulation film is substantially facilitated.

In the embodiments described heretofore, it should be noted that the conductor patterns 27a, 27d or 29A are by no means limited to a Ti pattern but a pattern of other refractory metals such as Ta, Mo, W, and the like, may also be used.

Similarly, the gate electrode 22 is by no means limited to an Al—Nd alloy or Al—Sc alloy but a refractory metal element such as W, Ta, Cr or Ti may also be used. The use of Al—Nd alloy or Al—Sc alloy is preferable, though, because of the low electrical resistance and resistance against hillock.

In the fourth embodiment, it is also possible to use an $SiO_2$ pattern or an SiON pattern for the SiN insulating pattern on the gate electrode 22. Further, the channel protection film 25 may be formed by $SiO_2$ or SiON.

Further, the present invention is by no means limited to the embodiments described heretofore, but various variations and modifications may be made without departing from the scope of the invention.

The present application is based on Japanese priority application No.10-147761 filed on May 29, 1998, the entire contents of which are hereby incorporated by reference.

What is claimed is:

1. A thin-film transistor having a protective insulation film covering said thin-film transistor and a pixel electrode provided on said protective insulation film in electrical connection with said thin-film transistor, comprising:

a gate electrode provided on a substrate;

a gate insulation film provided on said substrate so as to cover said gate electrode;

a semiconductor layer provided on said gate insulation film so as to cover said gate electrode when viewed in a direction perpendicular to a principal surface of said substrate;

a first ohmic electrode provided on said semiconductor layer so as to be located at a first side of said gate electrode when viewed in a direction perpendicular to said principal surface;

a second ohmic electrode provided on said semiconductor layer so as to be located at a second, opposite side of said gate electrode when viewed in a direction perpendicular to said principal surface;

said gate insulation film comprising:
an insulation pattern formed on said gate electrode; and
a pair of insulation films disposed on said substrate at both sides of a gate structure including said gate electrode and said insulation pattern, such that said pair of insulation films have respective surfaces continuing to a surface of said insulation pattern.

2. A thin-film transistor as claimed in claim 1, wherein said insulation pattern comprises a compound selected from a group of SiN, SiO$_2$ and SiON.

3. A thin-film transistor as claimed in claim 1, wherein said insulation film is formed of one of a spin-on-glass and a resin.

4. A liquid crystal display device, comprising:
a first substrate;
a second substrate facing said first substrate;
a liquid crystal layer confined between said first substrate and said second substrate;
a thin-film transistor provided on said first substrate;
a protective insulation film covering said thin-film transistor; and
a pixel electrode provided on said protective insulation film in electrical connection with said thin-film transistor, said thin-film transistor comprising:
a gate electrode provided on said first substrate;
a gate insulation film provided on said first substrate so as to cover said gate electrode;
a semiconductor layer provided on said gate insulation film so as to cover said gate electrode when viewed in a direction perpendicular to a principal surface of said first substrate;
a first ohmic electrode provided on said semiconductor layer so as to be located at a first side of said gate electrode when viewed in a direction perpendicular to said principal surface;
a second ohmic electrode provided on said semiconductor layer so as to be located at a second, opposite side of said gate electrode when viewed in a direction perpendicular to said principal surface;
said gate insulation film comprising:
an insulation pattern formed on said gate electrode; and
a pair of insulation films disposed on said first substrate at both sides of a gate structure including said gate electrode and said insulation pattern, such that said pair of insulation films have respective surfaces continuing to a surface of said insulation pattern.

* * * * *